United States Patent [19]

Datta

[11] Patent Number: 4,491,969

[45] Date of Patent: Jan. 1, 1985

[54] SATELLITE GROUND STATION

[75] Inventor: Ravi Datta, Kanata, Canada

[73] Assignee: Skyswitch Satellite Communications, Oklahoma City, Okla.

[21] Appl. No.: 422,189

[22] Filed: Sep. 23, 1982

[30] Foreign Application Priority Data

May 25, 1982 [CA] Canada .................................. 403648

[51] Int. Cl.³ .............................................. H04B 1/50
[52] U.S. Cl. ........................................ 455/75; 455/86
[58] Field of Search ...................... 455/12, 20, 22, 75, 455/76, 86, 87

[56] References Cited

U.S. PATENT DOCUMENTS 4,191,923  3/1980  Schelisch .............................. 455/12
4,246,539  1/1981  Haruki et al. ......................... 455/87

OTHER PUBLICATIONS

"An Experimental Domestic Satellite Earth Station" by Lulofs, 9/1977.

Primary Examiner—Jin F. Ng
Attorney, Agent, or Firm—Antonelli, Terry & Wands

[57] ABSTRACT

A frequency converter for use in a receive-transmit ground station in a satellite communication system, having improved frequency control characteristics and reduced cost. The converter utilizes three local oscillators, one of which is a voltage controlled oscillator. In the transmit channel, an output signal for transmission is obtained which is derived from the sum signals from each of three serially connected mixers, each receiving one of the local oscillator signals. In the receive channel, the receive signal is subtracted from the third local oscillator signal, the second local oscillator signal is subtracted from the result, and the final local oscillator signal is added to the result. A pilot tone is extracted from the resulting baseband signal, which is used to control the voltage controlled oscillator. The voltage controlled oscillator can be used either as the first or third local oscillator. The result is a converter in which drift caused by the third oscillator (closest to the antenna) is cancelled. Thus a much less expensive oscillator which need not be a precision oscillator can be used.

13 Claims, 5 Drawing Figures

SATELLITE GROUND STATION

This invention relates to earth satellite ground stations, and particularly to a frequency converter for use in a ground station.

In a communication system which uses an artificial earth satellite repeater, ground stations transmit to the repeater at one microwave frequency and receive from the repeater at a different microwave frequency. A typical example, and one which will be used in this disclosure, is for the uplink to be in the 14 gigahertz band and the downlink to be in the 12 gigahertz band. Where the signal consists of a large number of channels, it is extremely important that ground station transmitter frequency drift in particular should be minimized, to avoid adjacent channel crosstalk and distortion.

In order to stabilize the signal frequency, a pilot tone or signal is usually generated at a master ground station, and is transmitted with a signal to the satellite repeater. The satellite repeater injects the pilot signal into all downlink signals. Consequently each earth station can sense the frequency of the pilot signal and if drift occurs at the receive station, it uses a frequency or phase comparator to adjust its own transmit frequency, as well as the tuning of its down convertion circuitry.

Typically a baseband frequency signal at 70 megahertz is up-converted at the ground station to the transmit frequency of 14 gigahertz by a mixing process. Consequently it becomes essential that the local oscillator frequency used for mixing should be highly stable. The local oscillator frequency is usually obtained by multiplying a stable reference oscillator signal by between approximately 100 to 200 to obtain the final local oscillator frequency. Because of the large multiplication involved it becomes necessary that the reference oscillator should be of low phase noise, high spectral purity, and very stable. Clearly the reference oscillator is very expensive.

The present invention is a frequency converter in which frequency drift of the reference oscillator signal is cancelled out, and thus a highly stable reference oscillator is not required. Indeed, in the preferred embodiment, the reference oscillator can merely be a voltage controlled oscillator which is constantly being frequency corrected by any sensed frequency drift. The cost of the frequency converter is thus reduced substantially, and the apparatus used can be fabricated of commonly available relatively low cost components.

A better understanding of the invention will be obtained following an understanding of the prior art form of frequency converter, which will be described below, followed by a description of the present invention, with reference to the following drawings, in which.

Figure 1:
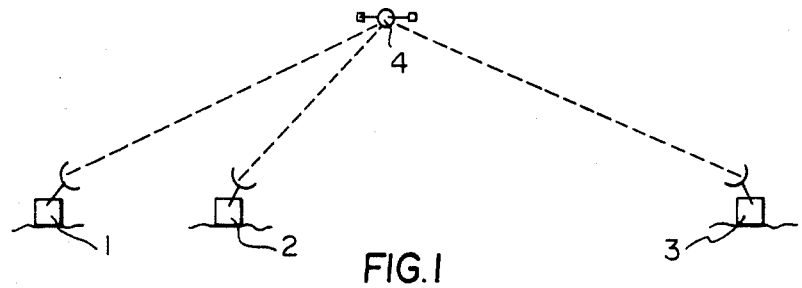
FIG. 1 is an illustration of a typical satellite communication system.

FIG. 1 shows a typical satellite communication system, which includes ground stations 1, 2 and 3 and an earth satellite 4. As mentioned earlier, in a typical communication system, each of the ground stations transmits for example in the 14 gigahertz band to the satellite 4. Satellite 4 contains a repeater including a down-converter, which converts the 14 gigahertz signal to a 12 gigahertz signal and transmits this to the earth's surface where it is received by other ground stations.

Figure 2:
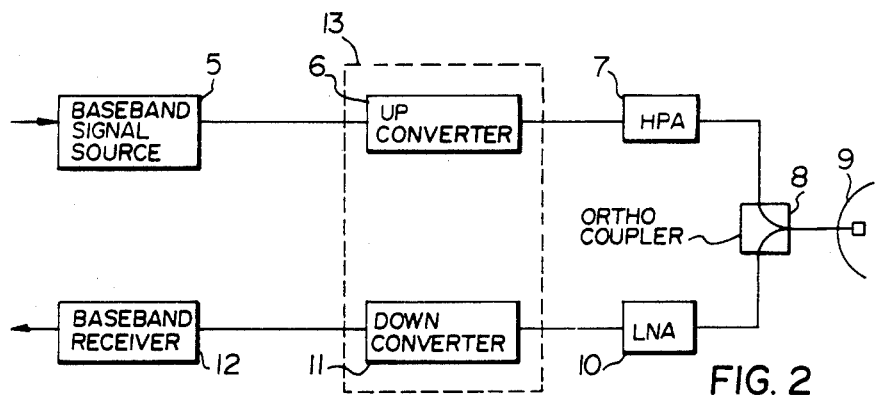
FIG. 2 is a block diagram of a typical ground station.

FIG. 2 shows a block diagram of a typical ground station. A baseband signal source 5 receives input signals from a ground network and provides an output signal, typically at 70 megahertz to an up-converter 6. Up-converter 6, using a mixing process, outputs the signal at 14 gigahertz to a high power amplifier 7, from which the signal is passed through ortho coupler 8 to an antenna 9. The signal is thus transmitted to the satellite.

A signal received from the satellite at antenna 9, typically at 12 gigahertz, is passed through ortho coupler 8, from which it passes through low noise amplifier 10 and is applied to down-converter 11. The resulting baseband signal is applied to baseband receiver 12 for application to a ground network.

The up-converter 6 and down-converter 11 are connected together with circuitry designed to stablize the transmit frequency and the intermediate frequency of the received signals passing through down-converter 11. To facilitate the frequency stabilization, a pilot signal is applied from a master ground station, e.g. ground station 2 as described earlier. The pilot signal is added by the satellite into the down-link signals received by each ground station.

It is to the frequency converter 13, which involves up-converter 6, down-converter 11, and ancillary frequency stabilizing circuitry to which the present invention is directed.

Figure 3:
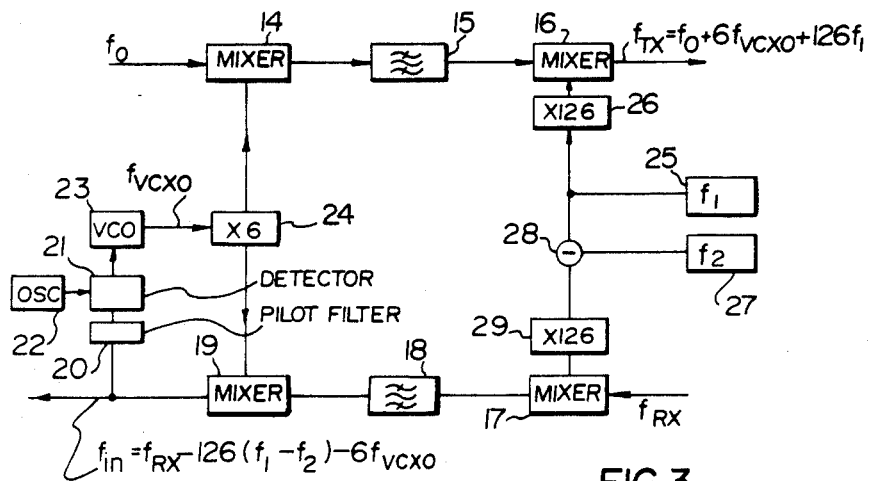
FIG. 3 is a block diagram of the frequency conversion portion of a ground station according to the prior art.

FIG. 3 is a block diagram of a frequency converter according to the prior art.

A baseband input signal $f_o$ is applied to one input of a mixer 14, where it is mixed with a signal to be described later. The output signal of mixer 14 is passed through a bandpass filter 15 and is applied to another mixer 16. Its output signal $f_{TX}$ is to be applied to a high power amplifier, e.g. element 7 of FIG. 2.

A received signal $f_{RX}$ from a low noise amplifier e.g. element 10 of FIG. 2, is applied to a mixer 17 with a signal to be described later, is passed through a bandpass filter 18 and is applied to another mixer 19. The output signal of mixer 19 $f_{in}$ is applied to a baseband receiver such as element 12 in FIG. 2 for distribution to the ground network.

The signal $f_{in}$ carries the pilot signal described earlier, which is retrieved by applying the signal $f_{in}$ to a pilot filter 20. The pilot signal is applied to a frequency detector 21 with the signal $f_{ref}$ from a reference oscillator 22. Any frequency difference between the pilot tone and the reference oscillator results in a voltage output of detector 21 which is applied to a voltage controlled oscillator 23. The output signal of the voltage controlled oscillator is multiplied in a frequency multiplier 24. The output signal of frequency multiplier 24 is applied as a local oscillator signal to both mixers 14 and 19.

The signal applied to mixer 16 is generated in an oscillator 25 and is multiplied in a frequency multiplier 26. A further oscillator 27 has the frequency of its signal subtracted from that of oscillator 25 in a mixer 28, and this different frequency is multiplied in multiplier 29 and is applied to the local oscillator signal input of mixer 17.

It will be clear that a phase locked loop is formed by pilot filter 20, phase detector 21, oscillator 23, multiplier 24 and mixer 19 with respect to the reference oscillator 22 signal and the pilot signal.

Assuming that the multiplier 24 multiplies the frequency of the output signal $f_{vcxo}$ of oscillator 23 by 6, and assuming that frequency multipliers 26 and 29 multiply their input frequencies by 126, it will be seen that the transmit output frequency of mixer 16 will be $$f_{TX} = f_o + 6f_{vcxo} + 126f_1. \quad (1)$$

Similarly, the output signal of mixer 19 will be $$f_{in} = f_{RX} - 126(f_1 - f_2) - 6f_{vcxo}. \quad (2)$$

For the case in which the aforenoted phase locked loop is locked, $f_{in} = f_{ref} = f_{pilot}$, and rearranging, $$6f_{vcxo} = f_{RX} - 126(f_1 - f_2) - f_{ref}. \quad (3)$$

Substituting $6f_{vcxo}$ into the transmit frequency equation (1) and cancelling gives $$f_{TX} = f_o + f_{RX} + 126f_2 - f_{ref}. \quad (4)$$

It may be seen that the local oscillator signal $f_1$ is cancelled, but that a source of error exists from oscillator 27 ($f_2$) and the reference 22 oscillator frequency $f_{ref}$.

The reference oscillator, having a baseband frequency corresponding to that of the pilot signal, can be manufactured having high stability without great cost, since a pilot frequency signal can be standardized and it can be manufactured using mass production techniques. The frequency of oscillator 27, however, is multiplied typically by 126 and therefore it must be highly stable. Further, it must be ordered having special frequency for each communication system. It has been found that the cost of oscillator 27 is about three times that of oscillator 25 at the time of the making of the present invention.

For oscillator 27 having a frequency of 20 megahertz, a drift of one part per million, multiplied by 126 in multiplier 29, causes a drift of 2.52 kilohertz. For satellite communication, such a drift is of major consequence which imposes severe requirements for the demodulator design.

In applicant's invention, free running oscillator 27 is eliminated, and in the preferred embodiment, free running oscillator 25 is also eliminated. Should drift in the replacement elements appear, it is cancelled.

Figure 4:
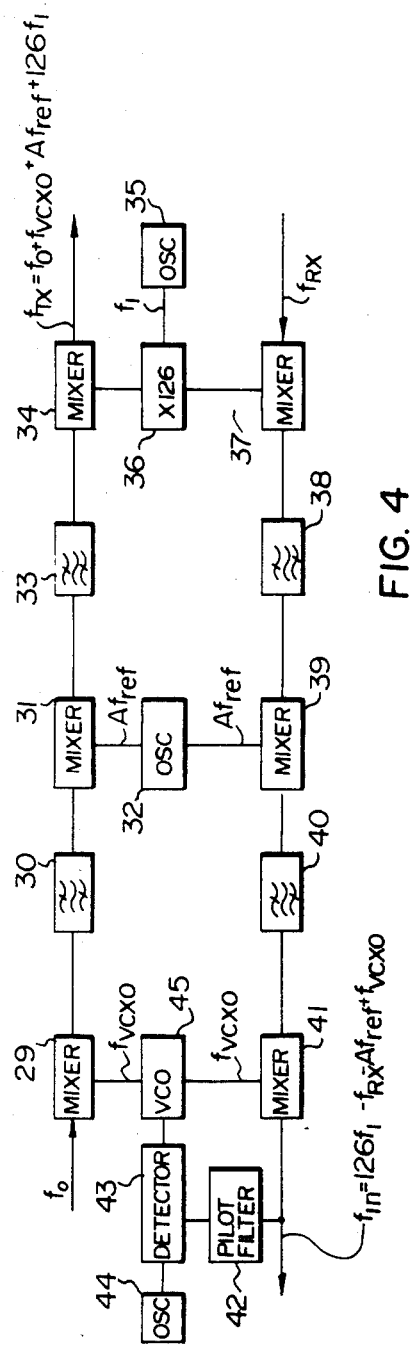
FIG. 4 is a block schematic of one form of the invention.
Figure 5:
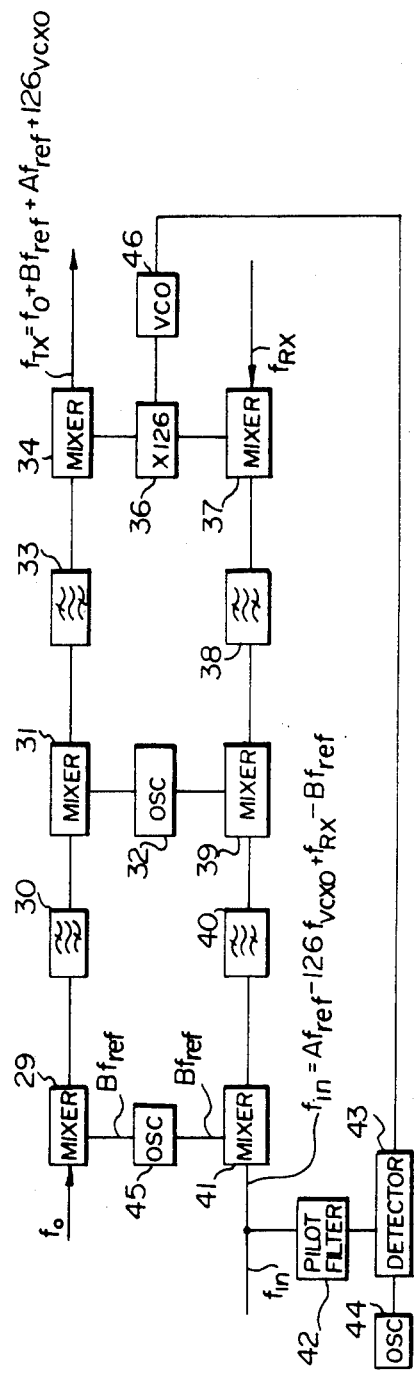
FIG. 5 is a block schematic of the invention according to a second embodiment.

One embodiment of applicant's invention is shown in block diagram of FIG. 4. While the preferred embodiment is shown in FIG. 5, FIG. 4 will be described first in order to provide a better understanding of the principles of this invention.

In the present invention, the oscillator 27, multiplier 29, mixer 28 and multiplier 24 of the prior art are deleted, while a further oscillator and a mixing stage in each of the up-conversion and down-conversion circuits are added. A baseband input signal $f_o$, e.g. of 70 megahertz, is applied to a first mixer 29, where it is mixed with a signal to be described later. The sum signal is passed through a bandpass filter 30, and applied to one input of another input mixer 31. A reference ' oscillator 32, generating a signal typically 1 gigahertz has its output signal applied to the second input of mixer 31.

The resulting signal sum is passed through bandpass filter 33 and is applied to mixer 34 to which a second signal is applied as will be described below.

An oscillator 35, corresponding to oscillator 25 in FIG. 3 has its output signal multiplied e.g. by 126, in frequency multiplier 36, the resulting signal being applied to the local oscillator input of mixer 34. This signal is also applied to the local oscillator input of mixer 37, to the signal input of which the received signal $f_{RX}$ is also applied. The resulting difference signal is passed through a bandpass filter 38 and is applied to one input of mixer 39 to which the output signal of reference oscillator 32 is also applied at a second input. The resulting difference signal is passed through bandpass filter 40 and is applied to one input of mixer 41, a second input to which a local oscillator signal is applied as will be described below. The output signal $f_{in}$ of mixer 41 is the output signal of the frequency converter to be applied to baseband receiver 12 as in FIG. 2.

The signal $f_{in}$ contains a pilot signal, as described earlier, which is passed through pilot filter 42 and is applied to one input of detector 43. The output signal of a reference oscillator 44 is applied to a second input of detector 43. The resulting output voltage, a frequency control signal, is applied to the control input of a voltage controlled oscillator 45. The output signal of oscillator 45 is applied to the local oscillator signal inputs of mixers 29 and 41.

As described with reference to the prior art circuit of FIG. 3, a frequency or phase locked loop is set up with the pilot signal being locked to the reference oscillator 44 signal, frequency and phase differences causing variation in the frequency and phase of oscillator 45. These changes cause correction in $f_{in}$ due to the mixing process in mixer 41, and correction of the transmit frequency due to the same variation in the frequency of oscillator 45 affecting the output frequency of mixer 29. Except for the elimination of frequency multiplier 24 in FIG. 3, the operation of the loop is similar to that of the prior art shown in FIG. 3.

An analysis of the operation of FIG. 4 follows. Assume that the output signal of oscillator 45 has frequency $f_{vcxo}$ and the output signal of oscillator 32 has frequency $Af_{ref}$. The frequency of oscillator 35 is $f_1$, while the baseband signal input to mixer 29 is $f_o$. Assume that in a typical installation multiplier 36 will multiply the frequency of oscillator 35 by 126 which would oscillate at e.g. 0.11 gigahertz.

Clearly the output signal from mixer 34 is of the frequency $f_{TX} = f_o + f_{vcxo} + Af_{ref} + 126f_1$. This signal is isolated from the other mixer output components in a bandpass filter which is commonly interposed between the frequency converter and the following high powered output amplifier.

The output signal frequency of mixer 37 is $126f_1 - f_{RX}$; the output signal of mixer 39 is $126f_1 - f_{RX} - Af_{ref}$, and the output signal of mixer 41 is $f_{in} = 126f_1 - f_{RX} - Af_{ref} + f_{vcxo}$.

Since in the pilot signal frequency locked condition, $f_{in} = f_{ref} = f_{pilot}$, $$-f_{vcxo} = 126f_1 - f_{RX} - Af_{ref} - f_{ref}$$

$$-f_{vcxo} = 126f_1 - f_{RX} - (A+1)f_{ref}$$

The transmit output frequency of mixer 34 was indicated as being $f_{TX} = f_o + f_{vcxo} + Af_{ref} + 126f_1$.

Substituting for $f_{vcxo}$ gives $f_{TX} = f_o + f_{RX} + (2A+1)f_{ref}$.

If in a typical system $A = 6$, $f_{TX} = f_o + f_{RX} + 13f_{ref}$. If $f_{ref} = 100 \times 10^6$ hertz, drift of one part per million in $f_{ref}$ is only 1.3 kilohertz.

Clearly not only has the drift been cut in half with respect to the prior art system, but the very costly oscillator 27 has been eliminated. Oscillator 32 ($Af_{ref}$) can be a common oscillator having approximately 1 gigahertz output frequency; drift therein causes only small variation in the drift of the entire apparatus. Clearly it need not be a precision oscillator.

Turning now to FIG. 5, the preferred form of the invention is shown. In this embodiment, the output of detector 43 is used to correct the frequency of oscillator 46 (a voltage controlled oscillator in place of oscillator 35) rather than oscillator 45 of FIG. 4. It should be noted that oscillator 35 is a customized oscillator, varying in frequency from customer to customer for various systems.

In FIG. 5, elements 29–34 and 36–44 are identical to that of FIG. 4 and operate similarly. However, in place of the variable frequency oscillator 45 as in FIG. 4, a fixed frequency reference oscillator 45 is used, its output signal being applied to the local oscillator inputs of mixers 29 and 41.

In place of oscillator 35 of FIG. 4, a variable frequency voltage controlled oscillator 46 is used. The control output voltage of detector 43 is applied to the control input of oscillator 46. Consequently phase or frequency variations in the pilot signal and the output signal of the reference oscillator 44 causes adjustment of the frequency of voltage controlled oscillator 46, thereby varying the output transmit frequency from mixer 34 as well as the intermediate frequency of the received signal at the output of mixer 37. The transmitted output signal frequency and the baseband received signals are thus stabilized in frequency.

Assuming that the frequency of oscillator 45 is $Bf_{ref}$, the transmitted output frequency of mixer 34 is $f_{TX} = f_o + Bf_{ref} + Af_{ref} + 126 f_{vcxo}$.

For the receive side of the converter, the output signal frequency of mixer 37 after filtering by filter 38 and the input frequency to mixer 39 is $126 f_{vcxo} - f_{RX}$. In mixer 39 this signal is subtracted from the $Af_{ref}$ signal, and the resulting signal component $Af_{ref} - (126 f_{vcxo} - f_{RX})$ is passed through filter 40 and is applied to one input of mixer 41, in which the frequency $Bf_{ref}$ from oscillator 45 is subtracted. As a result, signal $f_{in} = Af_{ref} - 126 f_{vcxo} + f_{RX} - Bf_{ref}$.

Since locking occurs when $f_{in} = f_{pilot}$, then $$126 f_{vcxo} = Af_{ref} + f_{RX} - Bf_{ref} - f_{pilot}.$$

Substituting this equation for $126 f_{vcxo}$ in the transmit frequency equation $f_{TX} = f_o + 2Af_{ref} + f_{RX} - f_{pilot}$. The pilot frequency signal is considered to be a stable source (there being only a single one at the primary ground station used for the entire system), any drift contributing to the transmit signal is caused by $2Af_{ref}$.

If $A = 6$, and $f_{ref} = 100 \times 10^6$, a one part per million variation in $f_{ref}$ causes a 1.2 kilohertz drift.

While this drift is only marginally smaller than the 1.3 kilohertz drift for one part per million determined with respect to the embodiment of the invention shown in FIG. 4, a significant benefit of the present embodiment is that special customer specified oscillator, oscillator 35 in FIG. 4, has been eliminated.

Further, since the oscillator signals $f_{vcxo}$ and $Bf_{ref}$ are both cancelled, oscillator 45 need not be highly stable. Oscillator 46 is a voltage controlled oscillator, and is inexpensive.

In summary, therefore, the invention is a frequency converter for a receive-transmit terminal useful in a ground station of an earth-satellite communication system comprising apparatus for generating a first local oscillator signal, for adding the first signal to a transmit baseband signal to form a first sum signal. A second local oscillator signal is generated, and the second signal is added to the first sum signal to form a second sum signal. A third local oscillator signal is generated and the third signal is added to the second sum signal to form a third sum transmission frequency signal. A signal is received at a receive frequency which is different from the transmit frequency, and the received frequency signal is subtracted from the third local oscillator frequency signal to form a first difference signal. The second local oscillator signal is subtracted from the first difference signal to form a second difference signal, and the first local oscillator signal is added to the second difference signal to obtain a receive baseband signal. The receive baseband signal includes a pilot frequency signal component. It is further preferred that the apparatus includes means for filtering the receive baseband signal to obtain a pilot frequency signal. A reference oscillator having a normal frequency similar to that of the pilot frequency signal has its frequency compared with that of the pilot frequency in a frequency or phase comparator and provides a control signal representative of the frequency or phase difference, which is applied to the first local oscillator signal generator for controlling its frequency in response to frequency or phase changes of the pilot frequency signal relative to that of the reference oscillator.

While the above has described the frequency converter as used in a satellite communication system ground station, it is of course not intended that the invention should be so limited, nor that the invention should be limited to the frequencies used for the examples above. Indeed, other frequencies and other applications of the invention may be used in other kinds of systems.

A person skilled in the art understanding this invention may now conceive of other embodiments or variations, using the principles described herein. All are considered to be within the sphere and scope of the invention as defined in the claims appended hereto.

I claim:

1. A frequency converter for a receive-transmit terminal useful in a ground station of an earth-satellite communication system comprising:
   (a) means for generating a first local oscillator signal,
   (b) means for adding said first signal to a transmit baseband signal to form a first sum signal,
   (c) means for generating a second local oscillator signal,
   (d) means for adding said second signal to the first sum signal to form a second sum signal,
   (e) means for generating a third local oscillator signal,
   (f) means for adding said third signal to the second sum signal to form a third sum transmission frequency signal,
   (g) means for receiving a receive frequency signal,
   (h) means for subtracting the receive frequency signal from the third local oscillator to form a first difference signal,
   (i) means for subtracting the second local oscillator signal from the first difference signal to form a second difference signal, and
   (j) means for adding the first local oscillator signal to the second difference signal to obtain a receive baseband signal.

2. A frequency converter as defined in claim 1 in which the receive baseband signal includes a pilot frequency signal component, further including means for filtering the receive baseband signal to obtain a pilot frequency signal, a reference oscillator having a nominal frequency similar to the pilot frequency signal, frequency or phase comparison means for receiving an output signal of the reference oscillator and the pilot frequency signal and providing a control signal representative of the frequency or phase difference therebetween, and means for applying the control signal to the first local oscillator signal generating means for controlling the frequency thereof in response to phase or frequency drift of the pilot frequency signal relative to that of the reference oscillator.

3. A frequency converter as defined in claim 2 in which the third local oscillator signal has a frequency of about 13.0 gigahertz, the transmission frequency signal has a frequency of about 14 gigahertz and the receive frequency signal has a frequency of about 12 gigahertz.

4. A frequency converter for a receive-transmit terminal useful in a ground station of an earth-satellite communication system comprising:
    (a) means for generating a first local oscillator signal,
    (b) means for adding said first signal to a transmit baseband signal to form a first sum signal,
    (c) means for generating a second local oscillator signal,
    (d) means for adding said second signal to the first sum signal to form a second sum signal,
    (e) means for generating a third local oscillator signal,
    (f) means for adding said third signal to the second sum signal to form a third sum transmission frequency signal,
    (g) means for receiving a receive frequency signal,
    (h) means for subtracting the receive frequency signal from the third local oscillator signal to form a first difference signal,
    (i) means for subtracting the first difference signal, and
    (j) means for subtracting the first local oscillator signal from the second difference signal to obtain a receive baseband signal.

5. A frequency converter as defined in claim 4 in which the receive baseband signal includes a pilot frequency signal component, further including means for filtering the receive baseband signal to obtain a pilot frequency signal, a reference oscillator having a nominal frequency similar to the pilot frequency signal, frequency or phase comparison means for receiving an output signal of the reference oscillator and the pilot frequency signal and providing a control signal representative of the frequency or phase difference therebetween, and means for applying the control signal to the third local oscillator signal generating means for controlling the frequency thereof in response to phase or frequency drift of the pilot frequency signal relative to that of the reference oscillator.

6. A frequency converter as defined in claim 5 in which the third local oscillator signal generating means is comprised of a voltage controlled oscillator.

7. A frequency converter as defined in claim 5 in which the third local oscillator signal generating means is comprised of a voltage controlled oscillator including a multiplier for multiplying the output signal to the frequency of the third local oscillator signal.

8. A frequency converter as defined in claim 7 in which the third local oscillator signal has a frequency of about 13.0 gigahertz, the transmission frequency signal has a frequency of about 14 gigahertz and the received frequency signal has a frequency of about 12 gigahertz.

9. A frequency converter as defined in claim 5 in which the first local oscillator signal generating means is comprised of a voltage controlled oscillator.

10. A frequency converter for a receive-transmit terminal useful in a ground station of an earth-satellite communication system comprising:
    (a) means for generating a first local oscillator signal,
    (b) means for receiving a first transmit baseband signal to be transmitted from the ground station,
    (c) means for mixing the first transmit baseband signal with the local oscillator signal to provide a first mixed signal,
    (d) a first bandpass filter for receiving the first mixed signal and passing a first sum signal comprised of the sum of the frequencies of the first local oscillator signal and the first transmit baseband signal,
    (e) means for generating a second local oscillator signal,
    (f) means for mixing the first sum signal with the second local oscillator signal to provide a second mixed signal,
    (g) second bandpass filter means for receiving the second mixed signal and passing a second sum signal comprised of the sum of the frequencies of the first sum signal and the second local oscillator signal,
    (h) means for generating a third local oscillator signal,
    (i) means for mixing the second sum signal and the third local oscillator signal to provide a transmit output signal which includes a frequency being the sum of the third oscillator signal and the second sum signal for application to a higher power output amplifier,
    (j) means for receiving an incoming received signal from an output of a low noise amplifier, the signal including a pilot signal,
    (k) means for mixing the received signal with the third local oscillator signal to provide a fourth mixed signal,
    (l) third bandpass filter means for passing a first difference signal having a frequency which is the difference between the third local osicllator signal frequency and the received signal frequency,
    (m) means for mixing the first difference signal with the second local oscillator signal to provide a fifth mixed signal,
    (n) bandpass filter means for passing a second difference signal having a frequency which is the difference between the first difference signal and the second local oscillator signal,
    (o) means for mixing the second difference signal with the first local oscillator signal to provide a receive baseband signal including the pilot signal,
    (p) a pilot signal filter for receiving the receive baseband signal and providing the pilot signal at its output,
    (q) a reference signal generator,
    (r) frequency or phase comparison means for receiving the output signal of the reference signal generator and the pilot signal and for providing a control output signal having amplitude related to the phase or frequency difference between the reference signal and the pilot signal, and
    (s) means for applying the control signal to either one of the first or third local oscillator signal generators for varying the frequency or phase thereof whereby the frequencies or phases of the receive baseband signal and of the transmit output signal are corrected to predetermined frequencies or phases.

11. A frequency converter as defined in claim 10 including a frequency multiplier, the third local oscillator signal generator including an oscillator having its output connected to the multiplier whereby a third local oscillator signal multiplied in frequency from the latter oscillator signal is generated.

12. A frequency converter as defined in claim 10 or 11 in which the control signal is applied to the first local oscillator signal generator for varying the frequency or phase thereof.

13. A frequency converter as defined in claim 10 or 11 in which the control signal is applied to the third local oscillator signal generator for varying the frequency or phase thereof.

* * * * *